(12) United States Patent
Eggers et al.

(10) Patent No.: US 7,116,737 B2
(45) Date of Patent: Oct. 3, 2006

(54) APPARATUS FOR SIGNALING THAT A PREDETERMINED TIME VALUE HAS ELAPSED

(75) Inventors: Georg Erhard Eggers, Munich (DE); Jorg Kliewer, Munich (DE); Ralf Schneider, Munich (DE); Norbert Wirth, Unterschleissheim (DE)

(73) Assignee: Infineon Technologies AG, Munich (DE)

( * ) Notice: Subject to any disclaimer, the term of this patent is extended or adjusted under 35 U.S.C. 154(b) by 806 days.

(21) Appl. No.: 10/253,793

(22) Filed: Sep. 24, 2002

(65) Prior Publication Data

US 2003/0072399 A1    Apr. 17, 2003

(30) Foreign Application Priority Data

Sep. 25, 2001    (DE) ............................... 101 47 081

(51) Int. Cl.
    *H04L 7/00* (2006.01)
(52) U.S. Cl. ..................... 375/354; 375/355; 327/144
(58) Field of Classification Search ............... 375/354, 375/355, 356, 364; 327/50, 58, 91, 94, 96, 327/141, 144, 151, 160, 178, 182
    See application file for complete search history.

(56) References Cited

U.S. PATENT DOCUMENTS 3,631,462 A * 12/1971 Dym ........................... 341/118
4,339,727 A    7/1982 Kage et al.
4,475,244 A * 10/1984 Taylor ........................... 455/42
4,897,857 A *  1/1990 Wakatsuki et al. .......... 375/317
5,084,704 A *  1/1992 Parrish ........................ 341/164
5,659,309 A *  8/1997 Takashi et al. ............... 341/50
5,822,573 A * 10/1998 Saeki et al. .................. 713/503
6,724,839 B1 * 4/2004 Chan et al. .................. 375/346

FOREIGN PATENT DOCUMENTS

DE          25 22 504 A1    12/1975

* cited by examiner

*Primary Examiner*—Chieh Fan
*Assistant Examiner*—Naheed Ejaz
(74) *Attorney, Agent, or Firm*—Jenkins, Wilson & Taylor, P.A.

(57) ABSTRACT

The present invention provides an apparatus for signaling that a predetermined time value has elapsed, having a device for acquiring and storing the amplitude value of a clock signal at an acquisition instant in the temporal profile of the clock signal. A device is provided for continuously comparing the acquired and stored amplitude value of the clock signal with an instantaneous amplitude value of the clock signal and for outputting a comparison signal which has a first logic state if the instantaneous amplitude value of the clock signal is less than the stored amplitude value and has a second logic state if the instantaneous amplitude value of the clock signal is greater than the stored amplitude value. A device is also provided for counting the number of logic states of the comparison signal which occur after the acquisition instant, and for signaling that the predetermined time value has elapsed if the counted number of logic states is equal to a predetermined number of logic states which corresponds temporally to the predetermined time value.

23 Claims, 3 Drawing Sheets

APPARATUS FOR SIGNALING THAT A PREDETERMINED TIME VALUE HAS ELAPSED

The present invention relates to an apparatus for signaling that a predetermined time value has elapsed, and in particular to an apparatus for signaling that a delay time value for integrated circuits has elapsed.

TECHNICAL FIELD

In electronic circuit technology or in integrated circuits, a precise control of delay times or delays is required. Such delay times are used for example for the addressing of memory cells in memory components, such as dynamic random access memories (DRAMS), during the reading in and out of data.

BACKGROUND ART

In the prior art, delay times are usually controlled with the aid of a simple circuit having a constant current source, a capacitor, which is connected in series with the current source and which stores the charge of a current over time with a characteristic charging curve, and a comparator, which is connected in parallel with the capacitor and which compares the voltage generated by a charge in the capacitor with a threshold value. The circuit uses the comparator to signal when a specific delay time has elapsed. To that end, the capacitor, which has a specific selected capacitance, is charged with a selected current of the constant current source, the charging duration depending on the selected capacitance and the selected current. If the voltage in the capacitor reaches a threshold voltage, this is signaled on account of a positive threshold value comparison at a comparator output. The duration until the signaling of the positive threshold value comparison corresponds to the delay time. The signaling can then be used in an integrated circuit for driving elements thereof, such as e.g. for enabling a read-in or -out operation of memory cells in a dynamic random access memory (DRAM).

The current sources in circuits for controlling a delay time usually comprise so-called "current mirrors". A current mirror comprises, by way of example, a first transistor, through which a reference current flows, and a second transistor, whose gate is connected to the gate of the first transistor and through which a mirror current flows, which has a specific relationship with the reference current depending on the transistor parameters. This mirror current is then used for charging the abovementioned capacitor.

One disadvantage of such circuits for controlling delay times is that variations and inaccuracies in the transistor parameters of the current mirrors and the capacitor parameters lead to inaccuracies and variations during the generation of the delay times. Such variations are caused for example by temperature and production variations, but also, in particular, by variations in the capacitor parameters over a chip.

A further disadvantage of circuits for controlling delay times is that capacitors having very high capacitances have to be used for controlling long delay times. This on the one hand increases the area requirement and the outlay of the circuits and on the other hand leads to inaccuracies in the determination of delay times with the aid of a threshold value due to the flat charging characteristic of capacitors having a large capacitance.

SUMMARY OF THE INVENTION

The object of the present invention is to provide an apparatus for signaling that a predetermined time value has elapsed, which apparatus is of simple and area-saving construction and accurately signals that a time value has elapsed, and an integrated circuit comprising such an apparatus.

This object is achieved by means of an apparatus for signaling that a predetermined time value has elapsed in accordance with Claim 1 and an integrated circuit in accordance with Claim 22.

The present invention provides an apparatus for signaling that a predetermined time value has elapsed, having a device for acquiring and storing the amplitude value of a clock signal at an acquisition instant in the temporal profile of the clock signal, the clock signal having, during a period thereof, a monotonically rising section and a monotonically falling section; a device for continuously comparing the acquired and stored amplitude value of the clock signal with an instantaneous amplitude value of the clock signal and for outputting a comparison signal, which has a first logic state if the instantaneous amplitude value of the clock signal is less than the stored amplitude value of the clock signal, and has a second logic state if the instantaneous amplitude value of the clock signal is greater than the stored amplitude value of the clock signal; and a device for counting the number of logic states of the comparison signal which occur after the acquisition instant, and for signaling that the predetermined time value has elapsed if the counted number of logic states is equal to a predetermined number of logic states which corresponds temporally to the predetermined time value.

One advantage of the present invention is that the accuracy of the apparatus for signaling that a predetermined time value has elapsed is essentially determined by the accuracy of a centrally generated clock signal which is used for the measurement of time values. By way of example, if a plurality of apparatuses for signaling that a predetermined time value has elapsed are used in distributed fashion over a chip, then the accuracy of the signaling that a respective time value has elapsed depends, in contrast to the prior art, not on the accuracy of each individual local delay circuit, which has, for example, a current mirror in each case but rather essentially on the accuracy of the clock signal. Thus, by way of example, all that is required is an accurately produced and accurately operating clock generator which generates a clock signal precisely and centrally and supplies it to apparatuses—distributed over a chip—for signaling that a time value has elapsed.

A further advantage of the present invention is that, by virtue of the fact that a clock signal is used for measuring that a predetermined time value has elapsed, it is possible to compensate for temperature variations and production variations of the circuit elements of the apparatus for signaling that a predetermined time value has elapsed, by variation of the clock signal.

A further advantage of the present invention is that the supplied time values, such as e.g. delay times, can be varied by changing the period duration of the clock signal which is used for measuring time values.

A further advantage of the present invention is that the measurement of a time value can be initiated at an arbitrary instant by each individual apparatus—positioned on a chip—for signaling that a time value has elapsed, independently of the phase angle of a centrally generated clock signal.

Advantageous developments and improvements of the apparatus specified in Claim 1 and of the integrated circuit specified in Claim 22 are found in the subclaims.

In accordance with one preferred development of the apparatus of the present invention, the apparatus furthermore has a device for control which controls the device for acquiring and storing the amplitude value of a clock signal in such a way that said device only acquires and stores amplitude values of a clock signal which are greater than a predetermined minimum amplitude value and which are less than a predetermined maximum amplitude value.

In accordance with a further preferred development, the device for control has a first input for receiving an information signal, which contains information about the clock signal, a second input for receiving a start signal, which, in the event of an active state thereof, initiates the acquisition and storage of the amplitude value of a clock signal, and an output for activating the device for acquiring and storing the amplitude value by means of an activation signal, the activation signal being activated depending on the instant of an active state of the start signal and depending on the information content of the information signal.

In accordance with a further preferred development, the device for control is arranged in such a way as to activate the activation signal in the event of an active state of the start signal only when the instantaneous amplitude value of the clock signal is greater than the predetermined minimum amplitude value and less than the predetermined maximum amplitude value.

In accordance with a further preferred development, the device for control, depending on the instant of the occurrence of an active state of a start signal, which, in the event of an active state thereof, activates the device for acquiring and storing the amplitude value of a clock signal, and depending on an information signal, which contains information about at least one clock signal, causes either a first clock signal or a second clock signal, which is phase-shifted with respect to the first clock signal, to be fed to the device for acquiring and storing the amplitude value of a clock signal in such a way that only amplitude values of the clock signals which are greater than the predetermined minimum amplitude value and which are less than the predetermined maximum amplitude value are acquired and stored.

One advantage of this preferred development is that the start signal can be forwarded without delay to the apparatus for acquiring and storing the amplitude value of the clock signal, in order to activate it immediately for the acquisition and storage of the amplitude value.

In accordance with a further preferred development, the apparatus has a device for generating at least one clock signal, the at least one clock signal having a specific period duration.

In accordance with a further preferred development, the device for generating at least one clock signal generates a first clock signal and a second clock signal, which is phase-shifted with respect to the first clock signal.

In accordance with a further preferred development, the device for generating at least one clock signal furthermore generates the information signal, which contains information about the at least one clock signal.

In accordance with a further preferred development, the information signal is the at least one clock signal.

In accordance with a further preferred development, the at least one clock signal has, during a period thereof, a monotonically rising first section and, subsequently in time, a monotonically falling second section.

In accordance with a further preferred development, the at least one clock signal has, during a period thereof, a monotonically falling first section and, subsequently in time, a monotonically rising second section.

In accordance with a further preferred development, the at least one clock signal has a sawtooth signal.

In accordance with a further preferred development, the first clock signal and the second clock signal are phase-shifted by 180° with respect to one another.

In accordance with a further preferred development, the device for counting the number of logic states of the comparison signal counts the number of first logic states of the comparison signal, and the predetermined number of logic states is a predetermined number of first logic states which corresponds temporally to the predetermined time value.

In accordance with a further preferred development, the device for counting the number of logic states of the comparison signal counts the number of second logic states of the comparison signal, and the predetermined number of logic states is a predetermined number of second logic states which corresponds temporally to the predetermined time value.

In accordance with a further preferred development, the device for acquiring and storing the amplitude value of a clock signal has a sample-and-hold circuit, which has a first input, at which the clock signal is present, and an output, at which the acquired and stored amplitude value is output, and which can be activated by the start signal, which is present at a second input thereof, in order to acquire the clock signal at the input thereof and to store the amplitude value.

In accordance with a further preferred development, the device for counting has an input, at which the start signal is present, in order to reset the device for counting to a start count in the event of the acquisition and storage of the amplitude value of a clock signal.

In accordance with a further preferred development, the device for continuous comparison has a comparator, which has a first input for the acquired and stored amplitude value, a second input for the clock signal and an output for the comparison signal.

In accordance with a further preferred development, the device for counting and for signaling has an output, at which said device indicates that the predetermined time value has elapsed by means of a signal.

In accordance with a further preferred development, the predetermined number of logic states of the device for counting, which corresponds temporally to the predetermined time value, is programmable.

In accordance with a further preferred development, the predetermined time value is a delay time for the temporal control of an integrated circuit.

In accordance with a preferred development of the integrated circuit of the present invention, the integrated circuit has a random access memory (RAM) or a dynamic random access memory (DRAM).

BRIEF DESCRIPTION OF THE DRAWINGS

Preferred exemplary embodiments of the present invention are explained in more detail below with reference to the accompanying drawings.

In the figures.

DETAILED DESCRIPTION OF THE INVENTION

Figure 1:
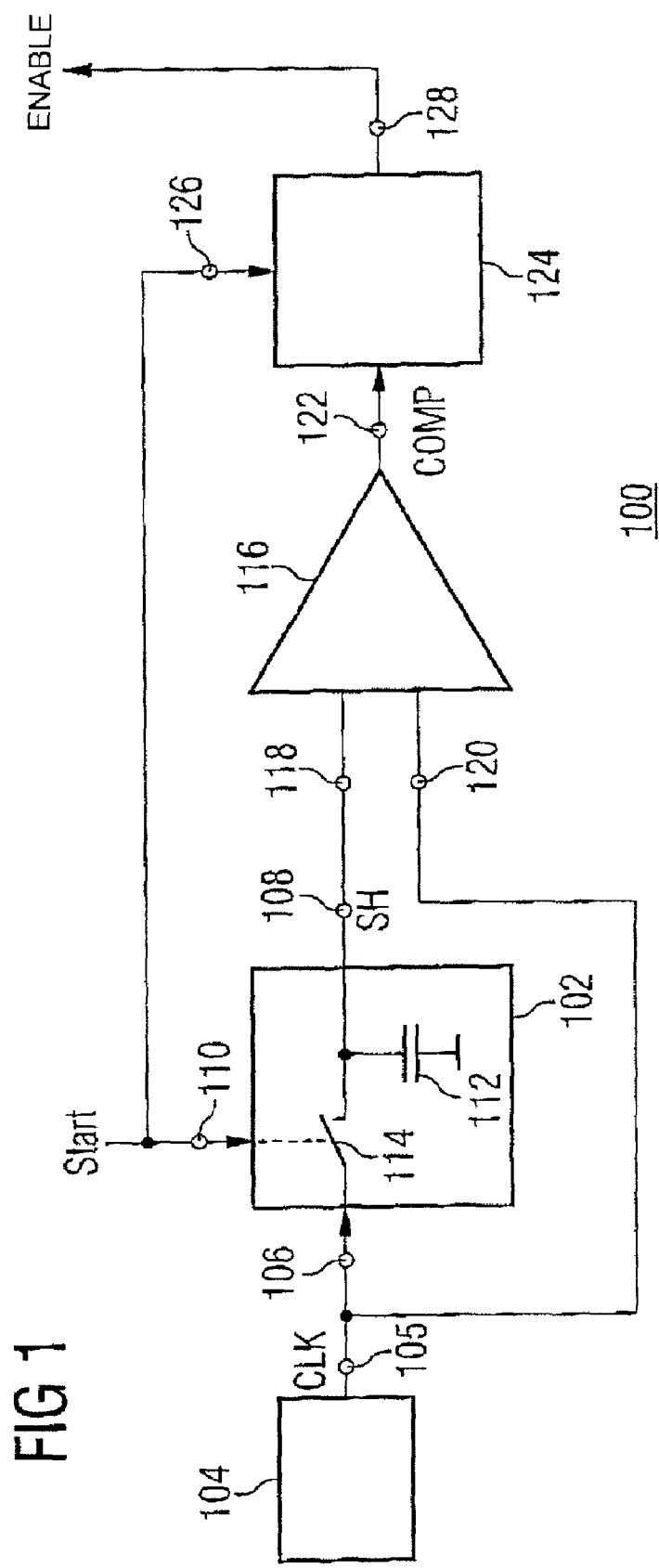
FIG. 1 shows a first preferred exemplary embodiment of an apparatus for signaling that a predetermined time value has elapsed, according to the present invention.

FIG. 1 shows a first exemplary embodiment of an apparatus for signaling that a predetermined time value has elapsed, according to the present invention. The predetermined time value is a time value which can be programmed into the apparatus 100 and corresponds to a time value after the elapsing of which with regard to a start time value the apparatus 100 outputs a signal in order to signal this elapsing. The predetermined time value is, for example, a delay time value for a memory module after the elapsing of which an enable signal is output in order to control read-in and -out operations for data into and from memory cells of the memory module.

The apparatus 100 has a device 102 for acquiring and storing the amplitude value of a clock signal at an acquisition instant in the temporal profile of the clock signal. The clock signal used is a time-continuous analog signal which generally has a monotonically rising profile of the amplitude value during one section of a period of said signal and a monotonically falling profile of the amplitude value during a further section of a period of said signal and has a specific period duration T. The clock signal is preferably a clock signal which has, during a period thereof, a monotonically rising first section and, subsequently in time, a monotonically falling second section, and is alternatively preferably a clock signal which has, during a period thereof, a monotonically falling first section and, subsequently in time, a monotonically rising second section. Such a clock signal is a sawtooth signal, for example, but any other clock signal which has the monotonic properties mentioned may be used.

The clock signal is preferably supplied by a device for generating a clock signal, which is arranged in a system in which the apparatus 100 is also arranged. Such a system is preferably a computer system having integrated circuits, such as e.g. random access memories (RAMs) or dynamic random access memories (DRAMs), and the device for generating a clock signal is, for example, a clock generator or system clock generator of the computer system, which supplies its clock signal or its system clock to various components of the computer system and integrated circuits. As an alternative, as is shown in FIG. 1, the clock signal may be supplied by a device 104 for generating a clock signal CLK, which is included in the apparatus 100 itself and has a first output 105, at which the clock signal CLK is supplied.

The device 102 for acquiring and storing the amplitude value of a clock signal CLK preferably has a sample-and-hold circuit 102. The sample-and-hold circuit has a first input 106, at which the clock signal CLK is present, and an output 108, at which the acquired and stored amplitude value SH is output. The sample-and-hold circuit 102 can be activated by a start signal START, which is present at a second input 110 thereof, in order to sample and store the amplitude value of the clock signal CLK at the first input 106 thereof. The sample-and-hold circuit 102 preferably has a capacitance 112, which is connected to ground by an end thereof and serves for storing the amplitude value of a clock signal CLK, and a switch 114, which can be opened selectively with the start signal (START) and connects the capacitance 112, at a further end thereof, to the first input 106 of the sample-and-hold circuit 102 in order to acquire or sample the amplitude value of the clock signal CLK. The switch 114 may be a transistor, for example.

The apparatus 100 for signaling that a predetermined time value has elapsed furthermore has a device 116 for continuously comparing the acquired and stored amplitude value SH of the clock signal CLK with an instantaneous amplitude value of the clock signal CLK and for outputting a comparison signal COMP. The comparison signal COMP has a first logic state if the instantaneous amplitude value of the clock signal CLK is less than the stored amplitude value SH of the clock signal CLK, and has a second logic state if the instantaneous amplitude value of the clock signal CLK is greater than the stored amplitude value SH of the clock signal CLK. The device 116 for continuous comparison preferably has a comparator 116, which has a first input 118 for the acquired and stored amplitude value SH of the clock signal CLK, a second input 120 for the clock signal CLK and an output 122 for outputting the comparison signal.

The apparatus 100 for signaling that a predetermined time value has elapsed as shown in FIG. 1 furthermore has a device 124 for counting the number of logic states of the comparison signal COMP which occur after the acquisition instant, i.e. the instant at which the device 102, triggered by the start signal START, acquires and stores an amplitude value of the clock signal CLK. The counting of the logic states of the comparison signal changes a count in the device 124, which is set to a start count before the beginning of counting or during the initialization of counting. The device 124 furthermore serves for signaling that the predetermined time value has elapsed if the counted number of logic states of the comparison signal COMP or the count is equal to a predetermined number of logic states which corresponds temporally to the predetermined time value. The number of counted logic states is a measure of the number of elapsed periods or clock cycles T of the clock signal, both a first logic state, such as e.g. a logic low (0) state, and a second logic state, such as e.g. a logic high (1) state, occurring during a clock cycle. This presupposes that a stored amplitude value SH of the clock signal is present in the device 102 for acquisition and storage and the device 102 is activated by the start signal START.

In a first variant of the device 124 for counting the number of logic states of the comparison signal COMP, the device 124 counts the number of first logic states of the comparison signal COMP. In this case, the predetermined number of logic states of the device 124 for counting is a predetermined number of first logic states of the comparison signal COMP, which corresponds temporally to the predetermined time value. After the activation of the device 102 by the start signal START, a first logic state occurs in each clock cycle T or during each period of the clock signal. If the number of first states is counted, then the number of elapsed clock cycles T is obtained.

In a second variant of the device 124 for counting the number of logic states of the comparison signal COMP, said device counts the number of second logic states of the comparison signal COMP. In this variant, the predetermined number of logic states is a number of second logic states of the comparison signal COMP, which corresponds temporally to the predetermined time value. After the activation of the device 102 for acquiring and storing the amplitude value SH of the clock signal CLK by the start signal START, a second logic state occurs in each clock cycle of the clock signal. If the number of second states is counted, then the number of elapsed clock cycles T is obtained.

The device 124 for counting and signaling preferably has an input 126, at which the start signal START is present, in order to initialize the device 124 in the event of the acquisition and storage of the amplitude value SH by the device 102 and to reset it to a start count, preferably 0. The device 124 for counting and for signaling furthermore has an output 128, at which said device signals the elapsing of the predetermined time value after the reaching of the assigned count for the logic states occurring in the comparison signal, by means of an enable signal ENABLE. The predetermined number of states, which is assigned to the predetermined time value or delay time value, can preferably be programmed into the device 124 for counting externally as end count. The end count is then compared with the present count during operation.

In a brief description of the function of the apparatus 100 for signaling that a predetermined time value has elapsed of FIG. 1, the instantaneous signal level SH of the clock signal CLK is stored by the sample-and-hold circuit 102 at the instant of a pulse of the start signal START at the second input 110 of the sample-and-hold circuit 102. The stored signal SH is then applied together with the clock signal CLK to the device 116 for continuous comparison or the comparator 116, which triggers the device 124 for counting or the counter. The counter 124 counts a predetermined number of cycles (a desired value) and then generates the enable signal ENABLE. This desired value may be programmed externally, as mentioned. The delay time between start signal and enable signal can thus be selected as a number of clock cycles and is independent of the phase angle of the clock signal of the device 104, e.g. an oscillator.

Figure 2:
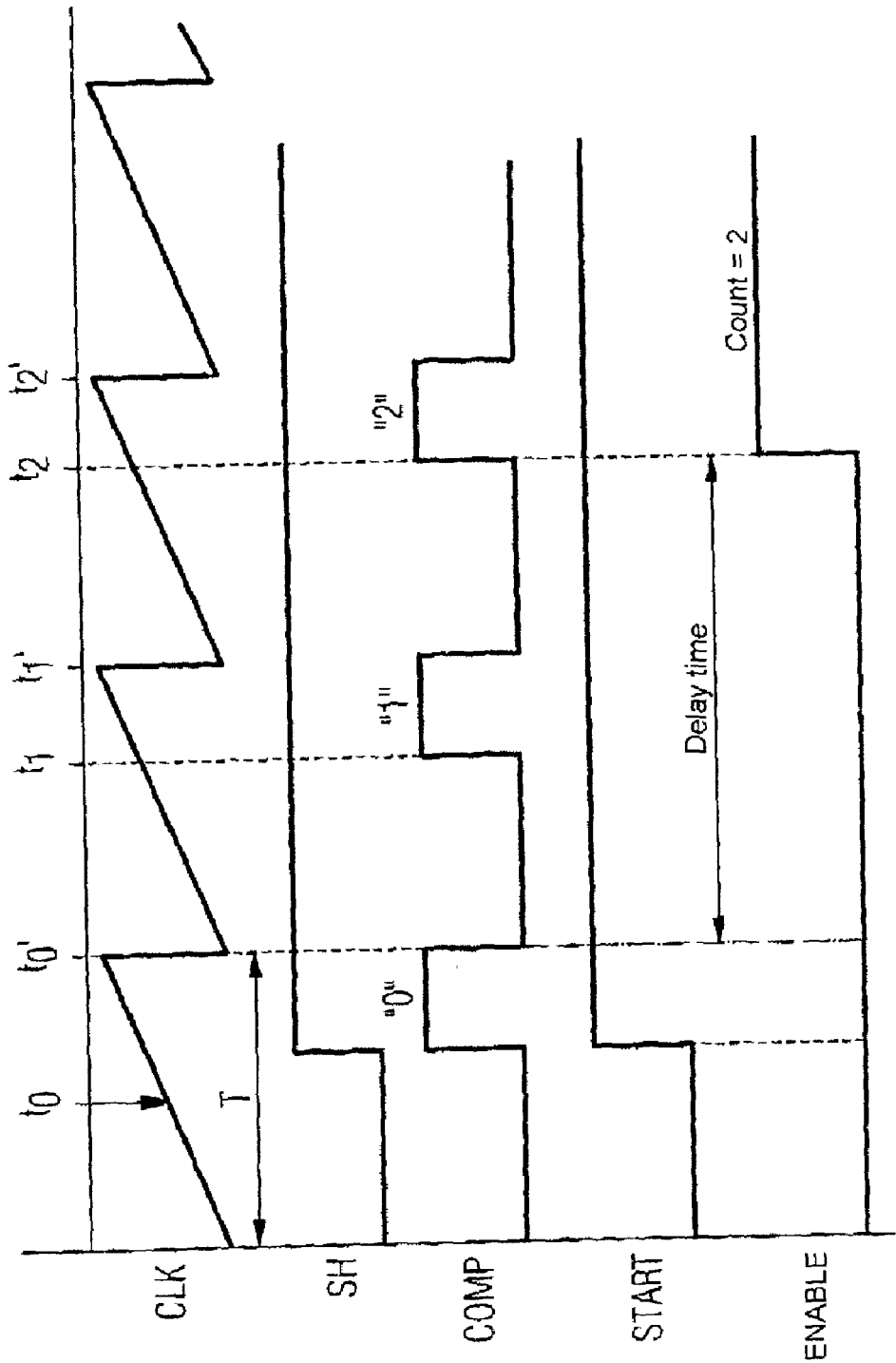
FIG. 2 shows a timing diagram for an apparatus according to FIG. 1.

FIG. 2 shows a timing diagram of the apparatus 100 according to the present invention. In the example shown in FIG. 2, the number of second logic states, in this case the logic high states, is counted by the device 124 for counting the number of logic states of the comparison signal COMP. The predetermined time value, for example the delay time value, in this case corresponds to a predetermined number of two second logic states of the comparison signal COMP, i.e. two clock cycles T of the clock signal.

In the example shown in FIG. 2, the device 104 for generating a clock signal CLK generates a clock signal having the form of a sawtooth signal. At an instant $t_0$, the device 102 for acquiring and storing the amplitude value of the clock signal is activated by the start signal START, which changes from a logic low state to a logic high state, so that the device 102 acquires and stores the amplitude SH of the clock signal CLK at this instant $t_0$ or the acquisition instant. This is shown at the changing state of the signal SH in FIG. 2. The amplitude value SH of the clock signal CLK is present at the first input 118 of the device 116 for continuous comparison. Since the clock signal CLK continues to rise following the acquisition instant $t_0$, the comparison of the acquired and stored amplitude value SH with the instantaneous amplitude value of the clock signal CLK has the result that the comparison signal COMP of the device 116 for continuous comparison, at the acquisition instant $t_0$, carries out a state change from the first logic state, in this case a logic low state, to a second logic state, in this case a logic high state. The second logic state of the comparison signal COMP at the output 122 of the device 116 for continuous comparison has the effect that the device 124 for counting acquires a first second state in the comparison signal COMP, which, in the case of this example, is not yet counted and, by way of example, may also be used for resetting the device 124 for counting to a start count of zero ("0"). At an instant $t_0'$, the clock signal CLK falls and is now smaller than the acquired and stored amplitude value SH of the clock signal CLK. The comparison signal COMP therefore changes its state from the second logic state to the first logic state.

At an instant $t_1$ one period duration T after the acquisition instant $t_0$, the amplitude of the instantaneous clock signal CLK again exceeds the stored amplitude value SH and again leads to the state change of the comparison signal COMP from a logic low to a logic high state. This state change or this occurrence of the second logic state of the comparison signal is acquired by the device 124 for counting and the internal count of the device 124 for counting is increased to a count "1". At an instant $t_1'$, the clock signal falls again and the comparison signal COMP changes its state again. This is also repeated at the instants $t_2$ and $t_2'$, a count of "2" then being reached within the device 124 for counting, said count corresponding to the predetermined time value. The device 124 for counting then signals the elapsing of the predetermined time value at the output 128 by activation of the enable signal ENABLE, which changes from a logic low state into a logic high state.

It shall be mentioned that, in alternative exemplary embodiments of the invention, the amplitude value SH of the clock signal CLK can be acquired by the sample-and-hold circuit 102 both in a monotonically rising section in the temporal profile of a period T of the clock signal CLK, as is shown in FIG. 2, and in a monotonically falling section of the clock signal CLK.

This is the case e.g. with sawtooth signals in which both the rising edge or the monotonically rising section and the falling edge or the monotonically falling section of the clock signal have a finite gradient and form, e.g. in each period, a tooth symmetrical with respect to half the clock period (T/2). Such sawtooth signals differ from the sawtooth signal in FIG. 2, which, at the instants $t_0'$, $t_1'$, $t_2'$, has a falling edge which ideally has an infinite gradient but in actual fact only a very large gradient, i.e. has a jump time which is very short in comparison with the reaction time of the sample-and-hold circuit.

Figure 3:
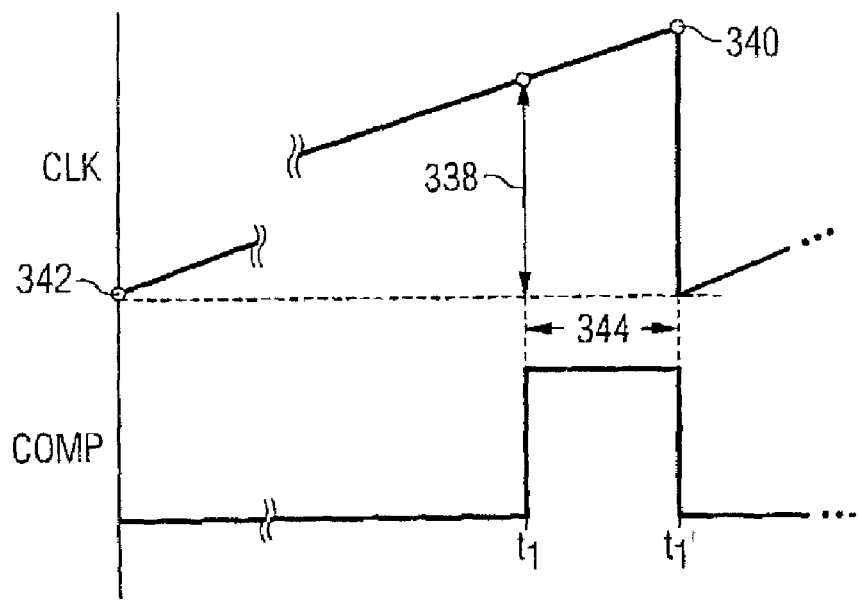
FIG. 3 shows a detail from the timing diagram of FIG. 2.

FIG. 3 shows a detail from the timing diagram of FIG. 2, i.e. a section of the clock signal CLK and a section of the comparison signal COMP in the vicinity of the instants $t_1$ and $t_1'$ of FIG. 2. In order to ensure error-free functioning of the apparatus 100 for signaling that a predetermined time value has elapsed, the dictates of technology mean that only amplitude values of the clock signal CLK which are less than a predetermined maximum amplitude value 338 can be sampled in the profile of the clock signal CLK. If an acquired amplitude value SH of the clock signal CLK is too near to the maximum amplitude value 340 of the clock signal, then cases can occur in which the clock signal CLK falls in later periods due to variations before reaching the acquired amplitude value SH, so that no state change of the comparison signal COMP is generated and, therefore, the device 124 for counting counts the number of states of the comparison signal incorrectly and signals the elapsing of a predetermined time value incorrectly, e.g. too late. This equally applies to the case in which the acquired amplitude value SH of the clock signal CLK is too near to the minimum amplitude value 342 of the clock signal CLK, and, by way of example, due to level fluctuations in the clock signal, the minimum amplitude value of the clock signal is not reached and erroneous counting of the device 124 for counting is therefore caused. Therefore, only amplitude values of the clock signal which are greater than a predetermined minimum amplitude value can be acquired or sampled.

A further malfunction of the apparatus for signaling may furthermore be caused, with reference to FIG. 3, by the fact that, due to a sampled amplitude value SH of the clock signal CLK lying too near to the maximum amplitude value 340 of the clock signal, i.e. e.g. the start signal START being generated too recently before the falling edge of the clock signal, the device 116 for comparison supplies a comparison signal COMP with excessively short pulses which possibly cannot be acquired by the device 124 for counting. Therefore, it is necessary to ensure a minimum pulse width or pulse length 344 of the comparison signal COMP.

To summarize, the device 102 for acquiring and storing the amplitude value SH of the clock signal CLK must be controlled in such a way that, on the one hand, the sampled amplitude SH is not too near to the maximum and minimum amplitude value 340, 342 of the clock signal CLK and, on the other hand, the supplied pulse width 344 of the comparison signal COMP is of sufficient length to enable proper counting. This can be done e.g. by delaying the action of the start signal START if the latter is too near to the instant of a change in monotonicity of the clock signal, such as e.g. too near to the amplitude values 340, 342 in FIG. 3. Such delaying of the action of the start signal START can be achieved for example with the aid of a signal buffer circuit or another delay circuit. Further exemplary embodiments of the present invention are described below which comprise modifications of the apparatus 100 of FIG. 1 and enable reliable operation thereof with regard to the problems described above.

Figure 4A:
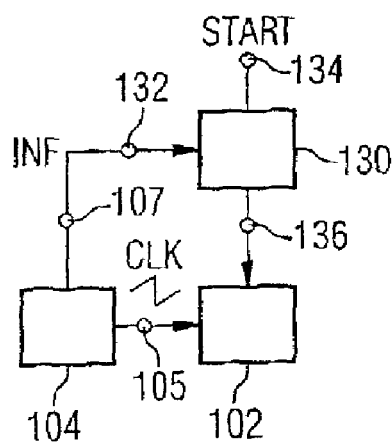
FIG. 4 shows a detail from a second and a third preferred exemplary embodiment of an apparatus for signaling that a predetermined time value has elapsed, according to the present invention.

FIG. 4a shows a detail from a second preferred exemplary embodiment of an apparatus for signaling that a predetermined time value has elapsed, according to the present invention. In this exemplary embodiment, the device 104 for generating a clock signal has a first output 105, at which the clock signal CLK is supplied, and a second output 107, at which an information signal INF is supplied. The information signal INF contains information about the clock signal CLK, such as e.g. the phase angle of the clock signal CLK, or preferably has the clock signal CLK itself. As an augmentation to the apparatus 100 of FIG. 1, the apparatus for signaling that a predetermined time value has elapsed furthermore has a device 130 for control, which controls the device 102 for acquiring and storing the amplitude value of a clock signal in such a way that said device only acquires and stores amplitude values of a clock signal which are greater than a predetermined minimum amplitude value and which are less than a predetermined maximum amplitude value. To that end, the device 130 for control has a first input 132 for receiving the information signal INF, a second input 134 for receiving the start signal START, which, in the event of an active state thereof, initiates the acquisition and storage of the amplitude value SH of a clock signal CLK, and an output 136 for activating the device 102, which preferably controls the switch 114 (FIG. 1) within a sample-and-hold circuit by means of an activation signal in order to activate said circuit. The device 130 for control monitors the information signal INF at the first input 132 thereof and ensures that the clock signal CLK, during the acquisition and storage of the amplitude value thereof, is within the limits defined by a maximum permissible and a minimum permissible amplitude value. If an active start signal START is present at the second input 134 of the device 130, the activation signal at the output 136 of the device 130 is activated immediately if proper operation of the apparatus 100 is ensured. However, if an active start signal START is present at the second input 134 of the device 130 and proper operation of the apparatus 100 is not ensured, the activation of the activation signal at the output 136 of the device 130 is delayed with regard to the start signal until proper operation is ensured. Therefore, expressed generally, the abovementioned information signal is a signal which, depending on the state thereof, activates or inhibits the forwarding of the action of the start signal START.

Figure 4B:
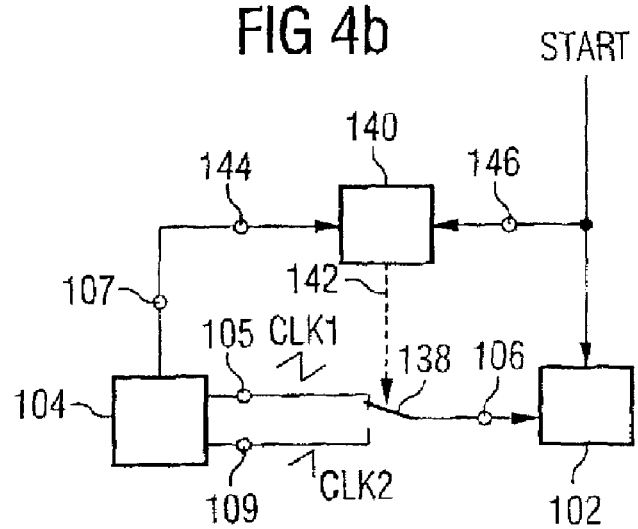

FIG. 4b shows a detail from a third preferred exemplary embodiment of an apparatus for signaling that a predetermined time value has elapsed, according to the present invention. In this exemplary embodiment, the device 104 for generating a clock signal has, in addition to the first output 105 (FIG. 1), at which a first clock signal CLK1 is supplied, and the second output 107, at which the information signal INF is supplied, a third output 109, at which a second clock signal CLK2 is supplied. The information signal INF in this case contains information about the clock signals CLK1 and CLK2, such as e.g. the phase angle thereof with respect to one another. The information signal INF is preferably the first clock signal CLK1, but may, as an alternative, also be the second clock signal CLK2 or a signal which specifies, for example depending on the state thereof, which clock signal CLK1, CLK2 can be used at a specific instant for measuring a time value, without jeopardizing the function of the apparatus 100. A switch 138 is arranged between the device 104 for generating the clock signals CLK1 and CLK2 and the device 102 for acquiring and storing the amplitude value of a clock signal, which switch optionally connects the first output 105 or the third output 109 of the device 104 to the input 106 of the device 102. In this exemplary embodiment, as an augmentation to the apparatus 100 of FIG. 1, the apparatus for signaling that a predetermined time value has elapsed furthermore has a device 140 for control, which controls the switch 138 by means of a control signal at an output 142 of said device in such a way that either the first clock signal CLK1 or the second clock signal CLK2 is fed to the device 102 for acquiring and storing the amplitude value of a clock signal. The device 140 for control has a first input 144, at which the information signal INF is present, and a second input 146, at which the start signal START is present, which is likewise present, as shown in FIG. 1, at the device 102 for acquiring and storing the amplitude value. The control signal at the output 142 of the device 140 is generated depending on the information signal INF at the first input 144 thereof and depending on the instant of the start signal START at the second input 146 thereof.

During operation of this third exemplary embodiment of the present invention, the device 104 for generating a clock signal preferably generates a second clock signal CLK2, which is phase-shifted with respect to the first clock signal CLK1. The first clock signal CLK1 and the second clock signal CLK2 are preferably identical sawtooth signals which are merely phase-shifted by 180° or half a clock period with respect to one another. In this case, the device 140 for control is arranged in such a way that, depending on the instant of the start signal START and depending on the information content of the information signal INF, a control signal is generated at the output 142 of the device 140, which signal controls the switch 138 in such a way that that clock signal of the clock signals CLK1, CLK2 is selected whose signal profile is not in the vicinity of a change in monotonicity or a jump in the clock signal, such as e.g. in the vicinity of the amplitude values 340, 342 in FIG. 3. The selected clock signal is then used for the entire control operation, i.e. until the time value to be signaled is measured with the selected clock signal.

One advantage of the present invention is that analog delay times or delays can be replaced by the use of a calibrated, central device for generating a clock signal or a clock generator. The individual delay times can be controlled centrally by the clock generator and be varied at the same time. This enables diverse areas of use, such as e.g. a delay time control which is temperature-, voltage- or frequency-dependent.

A further advantage of the present invention is that the delay brought about by the apparatus for signaling that a predetermined time value has elapsed can be effected without dependence on the phase angle of the clock signal. The continuous-time clock signal can be generated by a central clock generator which can preferably be calibrated individually by suitable measures, such as e.g. fusing or by temperature compensation. In the case of fusing, parameters of the clock generator are influenced by a laser bombardment and generally by a trimming possibility from outside an integrated circuit. In the case of temperature compensation, the temperature behavior is improved by means of a suitable circuit design.

LIST OF REFERENCE SYMBOLS

100 Apparatus for signaling that a predetermined time value has elapsed
102 Device for acquisition and storage
104 Device for generating a clock signal
105 First output of 104
106 First input of 102
107 Second output of 104
108 Output of 102
109 Third output of 104
110 Second input of 102
112 Capacitance
114 Switch
116 Device for continuous comparison
118 First input of 116
120 Second input of 116
122 Output of 116
124 Device for counting
126 Input of 124
128 Output of 124
130 Device for control
132 First input of 130
134 Second input of 130
136 Output of 130
138 Switch
140 Device for control
142 Output of 140
144 First input of 140
146 Second input of 140
338 Maximum acquired amplitude value
340 Maximum amplitude value of the clock signal
342 Minimum amplitude value of the clock signal
344 Minimum pulse width
CLK Clock signal
SH Acquired and stored amplitude value of CLK
COMP Comparison signal
START Start signal
ENABLE Enable signal
INF Information signal
CLK1 First clock signal
CLK2 Second clock signal Although the present invention is described above using preferred exemplary embodiments, it is not restricted thereto, but rather can be modified in diverse ways.

What is claimed is:

1. Apparatus (100) for signaling that a predetermined time value has elapsed, having:
a device (102) for acquiring and storing the amplitude value (SH) of a clock signal (CLK; CLK1, CLK2) at an acquisition instant ($t_0$) in the temporal profile of the clock signal (CLK; CLK1, CLK2), the clock signal (CLK; CLK1, CLK2) having, during a period (T) thereof, a monotonically rising section and a monotonically falling section;
a device (116) for continuously comparing the acquired and stored amplitude value (SH) of the clock signal (CLK; CLK1, CLK2) with an instantaneous amplitude value of the clock signal (CLK; CLK1, CLK2) and for outputting a comparison signal (COMP), which has a first logic state if the instantaneous amplitude value of the clock signal (CLK; CLK1, CLK2) is less than the stored amplitude value (SH) of the clock signal (CLK; CLK1, CLK2), and has a second logic state if the instantaneous amplitude value of the clock signal (CLK; CLK1, CLK2) is greater than the stored amplitude value (SH) of the clock signal (CLK; CLK1, CLK2); and
a device (124) for counting the number of logic states of the comparison signal (COMP) which occur after the acquisition instant ($t_0$), and for signaling that the predetermined time value has elapsed if the counted number of logic states is equal to a predetermined number of logic states which corresponds temporally to the predetermined time value.

2. Apparatus (100) according to claim 1, characterized in that the apparatus (100) furthermore has a device (130; 140) for control which controls the device (102) for acquiring and storing the amplitude value (SH) of a clock signal (CLK; CLK1, CLK2) in such a way that said device only acquires and stores amplitude values of a clock signal (CLK; CLK1, CLK2) which are greater than a predetermined minimum amplitude value and which are less than a predetermined maximum amplitude value (338).

3. Apparatus (100) according to claim 2, characterized in that the device (130) for control has a first input (132) for receiving an information signal (INF), which contains information about the clock signal (CLK), a second input (134) for receiving a start signal (START), which, in the event of an active state thereof, initiates the acquisition and storage of the amplitude value (SH) of a clock signal (CLK), and an output (136) for activating the device (102) for acquiring and storing the amplitude value (102) by means of an activation signal, the activation signal being activated depending on the instant of an active state of the start signal (START) and depending on the information content of the information signal (INF).

4. Apparatus (100) according to claim 3, characterized in that the device (130) for control is arranged in such a way as to activate the activation signal in the event of an active state of the start signal (START) only when the instantaneous amplitude value of the clock signal (CLK) is greater than the predetermined minimum amplitude value and less than the predetermined maximum amplitude value (338).

5. Apparatus (100) according to claim 2, characterized in that the device (140) for control, depending on the instant of the occurrence of an active state of a start signal (START), which, in the event of an active state thereof, activates the device (102) for acquiring and storing the amplitude value (SH) of a clock signal (CLK1, CLK2), and depending on an information signal (INF), which contains information about at least one clock signal, causes either a first clock signal (CLK1) or a second clock signal (CLK2), which is phase-shifted with respect to the first clock signal (CLK1), to be fed to the device (102) for acquiring and storing the amplitude value (SH) of a clock signal (CLK1, CLK2) in such a way that only amplitude values of the clock signals (CLK1, CLK2) which are greater than the predetermined minimum amplitude value and which are less than the predetermined maximum amplitude value (338) are acquired and stored.

6. Apparatus (100) according to one of the preceding claims, characterized
in that the apparatus (100) has a device (104) for generating at least one clock signal (CLK, CLK1, CLK2), the at least one clock signal (CLK; CLK1, CLK2) having a specific period duration (T).

7. Apparatus (100) according to claim 6, characterized
in that the device (104) for generating at least one clock signal generates a first clock signal (CLK1) and a second clock signal (CLK2), which is phase-shifted with respect to the first clock signal (CLK1).

8. Apparatus (100) according to claim 6 or 7, characterized
in that the device (104) for generating at least one clock signal (CLK; CLK1, CLK2) furthermore generates the information signal (INF), which contains information about the at least one clock signal (CLK; CLK1, CLK2).

9. Apparatus (100) according to claim 8, characterized
in that the information signal (INF) is the at least one clock signal (CLK; CLK1, CLK2).

10. Apparatus (100) according to one of claims 1 to 9, characterized
in that the at least one clock signal (CLK; CLK1, CLK2) has, during a period (T) thereof, a monotonically rising first section and, subsequently in time, a monotonically falling second section.

11. Apparatus (100) according to one of claims 1 to 9, characterized
in that the at least one clock signal (CLK; CLK1, CLK2) has, during a period thereof, a monotonically falling first section and, subsequently in time, a monotonically rising second section.

12. Apparatus (100) according to one of the preceding claims, characterized
in that the at least one clock signal (CLK; CLK1, CLK2) has a sawtooth signal.

13. Apparatus (100) according to claim 12, characterized
in that the first clock signal (CLK1) and the second clock signal (CLK2) are phase-shifted by 180° with respect to one another.

14. Apparatus (100) according to one of claims 1 to 13, characterized
in that the device (124) for counting the number of logic states of the comparison signal (COMP) counts the number of first logic states of the comparison signal (COMP), and the predetermined number of logic states is a predetermined number of first logic states which corresponds temporally to the predetermined time value.

15. Apparatus (100) according to one of claims 1 to 13, characterized
in that the device for counting the number of logic states of the comparison signal (COMP) counts the number of second logic states of the comparison signal (COMP), and the predetermined number of logic states is a predetermined number of second logic states which corresponds temporally to the predetermined time value.

16. Apparatus (100) according to one of claims to 3 to 15, characterized
in that the device (102) for acquiring and storing the amplitude value (SH) of a clock signal (CLK; CLK1, CLK2) has a sample-and-hold circuit (102), which has a first input (106), at which the clock signal (CLK; CLK1, CLK2) is present, and an output (108), at which the acquired and stored amplitude value (SH) is output, and which can be activated by the start signal (START), which is present at a second input (110) thereof, in order to acquire the clock signal (CLK; CLK1, CLK2) at the input thereof and to store the amplitude value (SH).

17. Apparatus (100) according to one of claims 3 to 15, characterized
in that the device (124) for counting has an input (126), at which the start signal (START) is present, in order to reset the device (124) for counting to a start count in the event of the acquisition and storage of the amplitude value (SH) of a clock signal (CLK; CLK1, CLK2).

18. Apparatus (100) according to one of the preceding claims, characterized
in that the device (116) for continuous comparison has a comparator (116), which has a first input (118) for the acquired and stored amplitude value (SH), a second input (120) for the clock signal (CLK; CLK1, CLK2) and an output (122) for the comparison signal (COMP).

19. Apparatus (100) according to one of the preceding claims, characterized
in that the device (124) for counting and for signaling has an output (128), at which said device indicates that the predetermined time value has elapsed by means of a signal (ENABLE).

20. Apparatus (100) according to one of the preceding claims, characterized
in that the predetermined number of logic states of the device (124) for counting, which corresponds temporally to the predetermined time value, is programmable.

21. Apparatus (100) according to one of the preceding claims, characterized
in that the predetermined time value is a delay time for the temporal control of an integrated circuit.

22. Integrated circuit having an apparatus (100) according to one of the preceding claims.

23. Integrated circuit according to claim 22, having a random access memory (RAM) or a dynamic random access memory (DRAM).

* * * * *